United States Patent
Cho et al.

(10) Patent No.: US 8,625,357 B2
(45) Date of Patent: Jan. 7, 2014

(54) LOCAL SELF-BOOSTING METHOD OF FLASH MEMORY DEVICE AND PROGRAM METHOD USING THE SAME

(75) Inventors: ByungKyu Cho, Seoul (KR); Kwang Soo Seol, Yongin-si (KR); Sunghoi Hur, Seoul (KR); Jungdal Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 340 days.

(21) Appl. No.: 12/917,634

(22) Filed: Nov. 2, 2010

(65) Prior Publication Data

US 2011/0103154 A1    May 5, 2011

(30) Foreign Application Priority Data

Nov. 2, 2009    (KR) .................. 10-2009-0105039

(51) Int. Cl.
*G11C 11/34*    (2006.01)

(52) U.S. Cl.
USPC ............. 365/185.23; 365/185.14; 365/185.28

(58) Field of Classification Search
USPC .................................................. 365/185.14
See application file for complete search history.

(56) References Cited

U.S. PATENT DOCUMENTS

| 7,212,435 | B2 | 5/2007 | Rudeck et al. | |
|---|---|---|---|---|
| 7,511,996 | B2 | 3/2009 | Kim | |
| 7,768,833 | B2 | 8/2010 | Lee | |
| 7,778,082 | B2 | 8/2010 | Shin et al. | |
| 2008/0130360 | A1* | 6/2008 | Kim | 365/185.02 |
| 2008/0279008 | A1* | 11/2008 | Dong et al. | 365/185.17 |
| 2009/0016112 | A1* | 1/2009 | Lee | 365/185.17 |
| 2009/0040833 | A1* | 2/2009 | Shin et al. | 365/185.19 |

FOREIGN PATENT DOCUMENTS

| KR | 10 2009-0014531 A | 2/2009 |
|---|---|---|
| KR | 10 2009-0052510 A | 5/2009 |

* cited by examiner

*Primary Examiner* — Anthan Tran
(74) *Attorney, Agent, or Firm* — Lee & Morse, P.C.

(57) ABSTRACT

Provided is a local self-boosting method of a flash memory device including at least one string having memory cells respectively connected to wordlines. The local self-boosting method includes forming a potential well at a channel of the string and forming potential walls at the potential well to be disposed at both sides of a channel of a selected one of the memory cells. The channel of the selected memory cell is locally limited by the potential walls and boosted when a program voltage is applied to the selected memory cell.

14 Claims, 11 Drawing Sheets

LOCAL SELF-BOOSTING METHOD OF FLASH MEMORY DEVICE AND PROGRAM METHOD USING THE SAME

BACKGROUND

1. Field

Embodiments relate to semiconductor devices and, more particularly, to a local self-boosting method of a flash memory device.

2. Description of the Related Art

Semiconductor memories are considered to be the most vital microelectronic components of digital logic system design, e.g., in computers and microprocessor-based applications ranging from satellite to customer electronics. Therefore, advances in fabrication of semiconductor memories, including process enhancements and technology developments through scaling for higher densities and faster speeds, help establish performance standards for other digital logic families.

Generally, semiconductor memory devices are categorized as volatile memory devices or non-volatile memory devices. In volatile memory devices, logic information is stored by setting a logic state of a bistable flip-flop in case of a static random access memory (SRAM) or by charging a capacitor in case of a dynamic random access memory (DRAM). In a volatile memory device, data is stored and read while power supply is continued and lost when power supply is interrupted.

Nonvolatile memory devices (e.g., MROM, PROM, EPROM, and EEPROM) can retain their stored data even when their power supplies are interrupted. The data stored state of a non-volatile memory may be permanent or reprogrammable according to applicable manufacturing techniques. A non-volatile memory device may be used for storing programs and microcodes in a wide range of applications, e.g., computers, avionics, communications, and consumer electronic technology industries. If a system requires a non-volatile memory that is reprogrammable and is capable of promptly combining of volatile and non-volatile memory storing modes in a single chip, a non-volatile RAM (nvRAM) may be used for the system. Moreover, a certain memory structure with additional logic circuits has been developed and may optimize performance for an application oriented task.

With non-volatile semiconductor memory devices like MROM, PROM, and EPROM, it may not be easy to erase and write data, and a general user may experience difficulties in updating memory contents. On the contrary, EEPROM may erase and write data electrically without difficulty and may become widely used in system programming for continuous updating and also auxiliary memory devices.

A flash memory device is a kind of EEPROM where a plurality of memory regions called cells can be erased or programmed through a single program operation. A conventional EEPROM enables only one memory region to be erased or programmed at onetime. This means that a flash memory device can operate at a higher and more effective speed. After a specific number of erase operations, all types of flash memories and EEPROM may wear out due to a breakdown of an insulating layer covering charge storage means used to store data.

SUMMARY

The present disclosure provides methods for use with a flash memory device including at least one string having memory cells respectively connected to wordlines and a flash memory device using the same.

In some exemplary embodiments, a local self-boosting method may include forming a potential well at a channel of the string and forming potential walls at the potential well to be disposed at both sides of a channel of a selected one of the memory cells. The channel of the selected memory cell is locally limited by the potential walls and boosted when a program voltage is applied to the selected memory cell.

In other exemplary embodiments, a program method may include precharging a channel of the string according to program data, driving the wordlines with a first pass voltage, driving at least one wordline adjacent respectively to both sides of a selected one of the wordlines with a second pass voltage, and driving the selected wordline with a program voltage.

In other exemplary embodiments, a program method may include precharging a channel of the string according to program data, driving the wordlines with a first pass voltage, driving at least one wordline adjacent respectively to both sides of a selected one of the wordlines and the other wordlines except the selected wordline with a second pass voltage, and driving the selected wordline with a program voltage.

In still other exemplary embodiments, a flash device is provided which includes at least one string having memory cell respectively connected to wordlines and a control logic configured to control voltage to be supplied to the wordlines during a program operation. The control logic controls voltages of the wordlines such that the program operation is performed by a local self-boosting manner including forming a potential well at a channel of the string and forming potential walls at the potential well to be disposed at both sides of a channel of a selected one of the memory cells.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
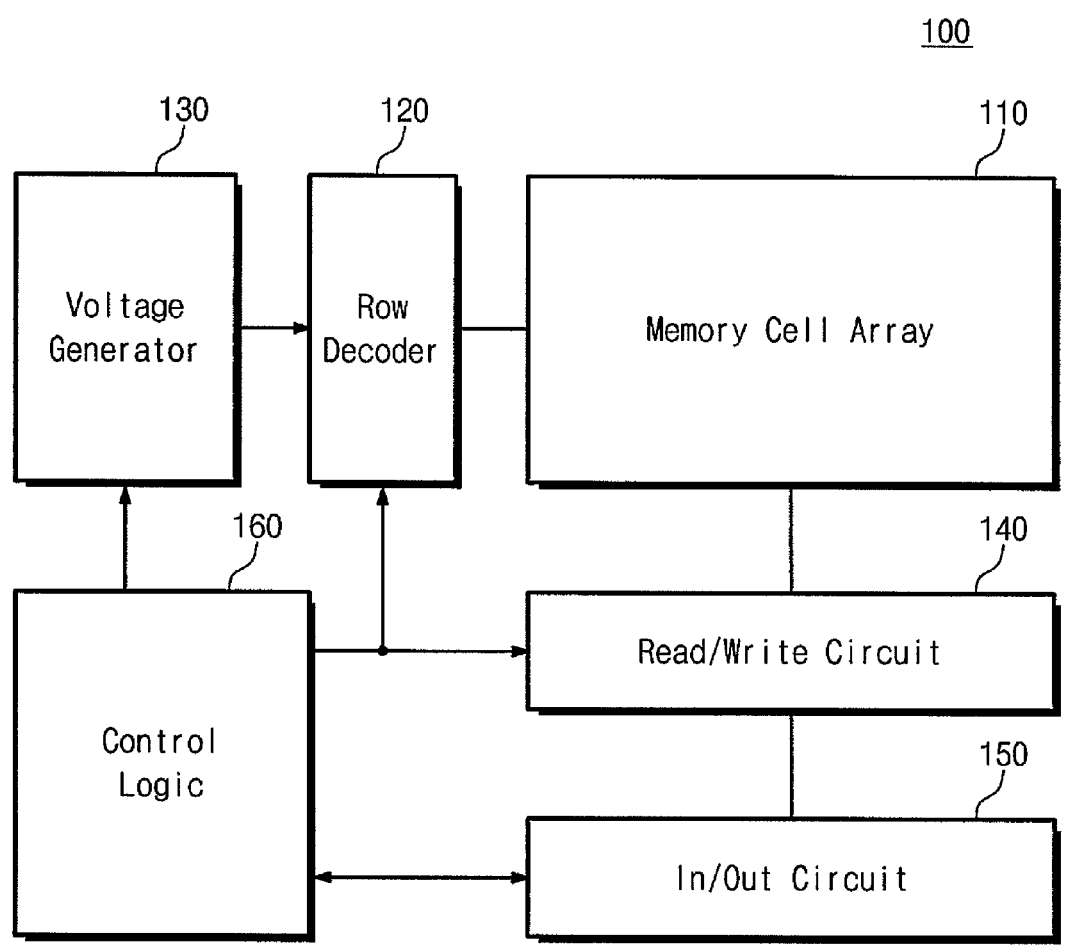
FIG. 1 illustrates a block diagram of a flash memory device according to an exemplary embodiment of the present inventive concept.

Korean Patent Application No. 10-2009-0105039, filed on Nov. 2, 2009, in the Korean Intellectual Property Office, and entitled: "Local Self-Boosting Method of Flash Memory Device and Program Method Using the Same," is incorporated by reference herein in its entirety.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

FIG. 1 illustrates a block diagram of a flash memory device 100 according to an exemplary embodiment of the present inventive concept. The flash memory device 100 may include a memory cell array 110 storing data information. The memory cell array 110 includes a plurality of memory cells arranged in rows and columns. Each of the memory cells may store single-bit data or multi-bit data, e.g., two or more bits of data. Each of the memory cells may include a floating gate, a charge storage layer, e.g., a charge trapping layer, and a memory transistor having variable resistance.

As shown in FIG. 1, the flash memory device 100 may further include a row decoder circuit 120, a voltage generator circuit 130, a read/write circuit 140, an input/output circuit 150, and a control logic 160.

The row decoder circuit 120 may be controlled by the control logic 160 to select and drive rows of the memory cell array 110. The row decoder circuit 120 may be configured to drive rows of the memory cell array 110 with a positive high voltage and a negative voltage. The voltage generator circuit 130 may be controlled by the control logic 160 to generate voltages (e.g., program voltage, read voltage, negative voltage, etc.) to be supplied to the memory cell array 110. The read/write circuit 140 may be controlled by the control logic 160 to read data from selected memory cells of the memory cell array 110 during a read operation. The read/write circuit 140 may be configured to drive columns (or bitlines) of the memory cell array 110 with a power supply voltage (referred to as "bitline program inhibit voltage") or a ground voltage (referred to as "bitline program voltage") according to data to be programmed. For example, the read/write circuit 140 may include a page buffer block and a column select block (or a page buffer block, a column select block, and a pass/fail check block). The input/output circuit 150 may be controlled by the control logic 160 and configured to interface data between the read/write circuit 140 and an external device. The control logic 160 may be configured to control the overall operation of the flash memory device 100.

A flash memory device according to an exemplary embodiment of the present inventive concept may be configured to inhibit a memory cell from programming using local self-boosting. Especially, a flash memory device according to an exemplary embodiment of the present inventive concept may control a voltage of a string channel corresponding to a program-inhibited memory cell such that local self-boosting is conducted while a low voltage is not used. For example, a channel of a program-inhibited memory cell may be locally limited by potential walls. The locally limited channel (corresponding to the program-inhibited memory cell) may be boosted without charge sharing. These potential walls may be established by various wordline bias conditions, which will be described in detail below.

Figure 2:
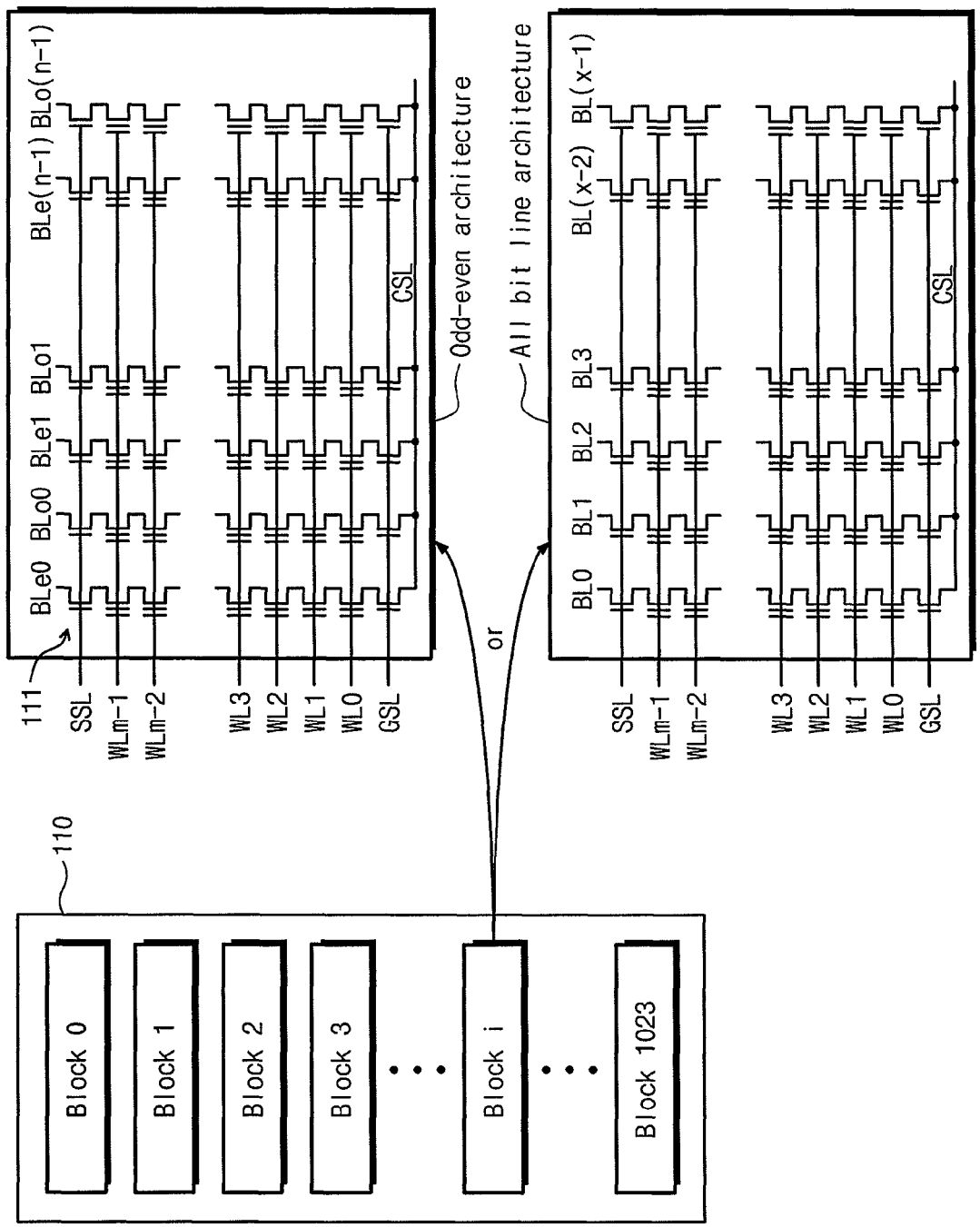
FIG. 2 illustrates an example of an organization of a memory cell array into memory blocks for an all-bitline memory architecture or for an odd-even memory architecture.

FIG. 2 illustrates an example of an organization of a memory cell array into memory blocks for an all bitline memory architecture or for an odd-even memory architecture. Exemplary structures of a memory cell array 110 are described. As one example, a NAND flash memory device having a memory cell array 110 partitioned into 1024 memory blocks is described. The data stored in each block may be simultaneously erased. In one embodiment, the block is the minimum unit of storage elements that are simultaneously erased. In each block, for example, there are 8512 columns corresponding to bitlines (e.g., bitlines of 1 KB). In one embodiment referred to as an all bit line (ABL) architecture, all bitlines of a memory block may be simultaneously selected during read and program operations. Storage elements along a common wordline and connected to any bitline, may be simultaneously programmed.

In an exemplary embodiment, a plurality of storage elements along a column may be serially connected to form a NAND string. One terminal of the NAND string is connected to a corresponding bitline through a select transistor controlled by a string select line SSL, and another terminal thereof is connected to a common source line CSL through a select transistor controlled by a ground select line GSL.

In another exemplary embodiment referred to as an odd-even architecture, bitlines are divided into even bitlines (BLe) and odd bit lines (BLo). In the odd/even bitline architecture, storage elements along a common wordline and connected to odd bitlines are programmed within an hour, while storage elements along a common wordline and connected to even bitlines are programmed within two hours. Data may be programmed into different blocks and read from different blocks, which may be accomplished concurrently.

In an exemplary embodiment, memory blocks of a memory cell array may be arranged to have a two- or three-dimensional array structure.

Figure 3:
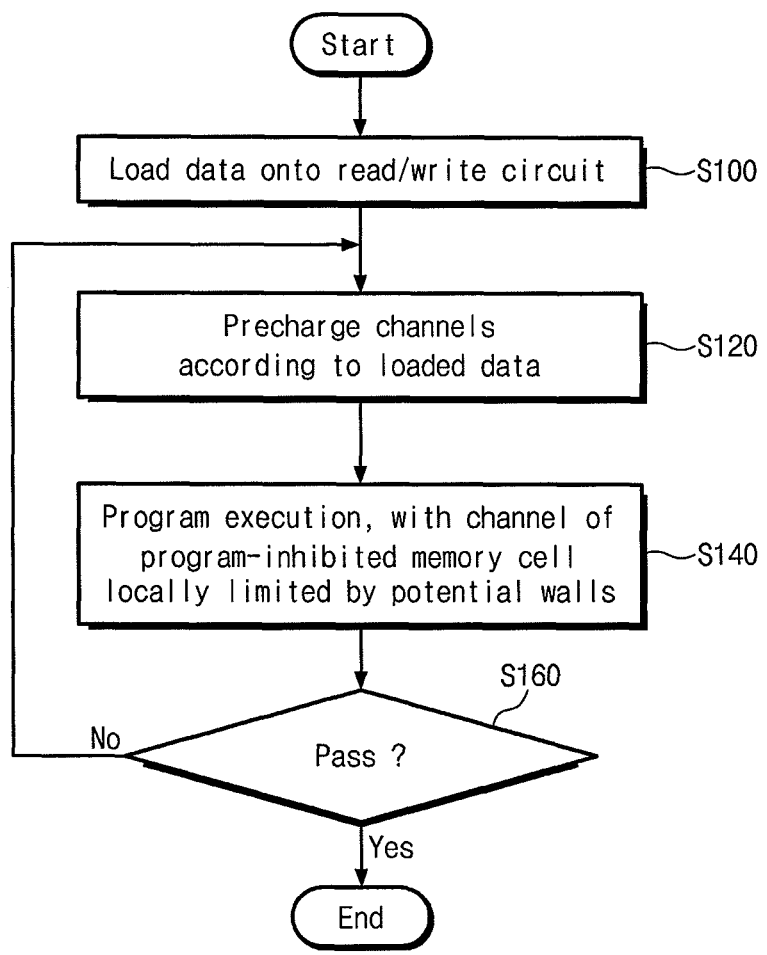
FIG. 3 illustrates a flowchart of a program method of a flash memory device according to an exemplary embodiment of the present inventive concept.

FIG. 3 illustrates a flowchart of a program method of a flash memory device according to an exemplary embodiment of the present inventive concept. Hereinafter, a program method of a flash memory device according to an exemplary embodiment of the present inventive concept will now be described with reference to accompanying drawings.

In operation S100, data to be programmed is loaded onto the read/write circuit 140 through the input/output circuit 150 under the control of the control logic 160. The read/write circuit 140 may include page buffers connected to each bitline or each pair of bitlines along a bitline structure. For example, in case of an ABL structure, the read/write circuit 140 may include page buffers connected to each bitline. In case of an odd/even bitline structure, the read/write circuit 140 may include page buffers connected to each pair of bitlines (BLo and BLe). After the data to be programmed is loaded onto the read/write circuit 140, i.e., page buffers, the flow proceeds to operation S120.

In the operation S120, channels of strings may be pre-charged according to loaded data under the wordline bias condition that wordlines are driven with a predetermined voltage (e.g., 0 volt or higher voltage or lower voltage). For example, when loaded data is data '1' indicating program inhibition of a memory cell, a string channel may be precharged to a voltage of Vcc−Vth under the above wordline bias condition (Vcc being a power supply voltage supplied to a bitline, and Vth being a threshold voltage of a string select transistor). On the other hand, when loaded data is data '0' indicating programming of a memory cell, a string channel may be precharged to a ground voltage under the above wordline bias condition. During the channel precharge operation, a string select line SSL and a ground select line GSL may be biased to a power supply voltage and a ground voltage, respectively.

When the channel precharge operation is completed, the flow precedes to operation S140 (program execution operation S140) in which memory cells belonging to a selected wordline (the memory cells including memory cells to be programmed and memory cells to be program-inhibited) are substantially programmed. Particularly, the flash memory device 100 according to an exemplary embodiment of the present inventive concept may perform program inhibition of memory cells by means of a local self-boosting scheme. In case of a flash memory device according to an exemplary embodiment of the present inventive concept, a low voltage for dividing a string channel may not be provided to a word-line (wordlines) adjacent to a selected wordline. Although a low voltage for dividing a string channel may not be provided to a wordline (wordlines) adjacent to a selected wordline, a channel of a memory cell to be program-inhibited may be locally self-boosted. The local self-boosting may be done by locally limiting the channel of a memory cell to be program-inhibited via potential walls, which may be achieved under various wordline bias conditions and will be described in detail later. Memory cells may be selectively programmed under the condition.

In operation S160, whether the programming of the selected memory cells is "PASS" determined. This may be done based on data read from memory cells. For example, the read/write circuit 140 reads data from selected memory cells through bitlines in compliance with the control of the control logic 160. A pass/fail check circuit (not shown) of the control logic 160 may check whether bits of the read data are all pass or if any fail. The pass/fail circuit may be embodied using various manners. For example, a pass/fail check circuit may check whether programming is "PASS" using a wired OR manner, a column scanning manner, or any manner known in the art. If a checking result is "PASS", the flow comes to an end. On the other hand, if the check result is "FAILURE", the flow proceeds to the operation S120. The operations S120~S160 are repeated until checking the programming of the selected memory cells is "PASS".

An example of a pass/fail check circuit is disclosed in U.S. Pat. No. 6,282,121 entitled in "FLASH MEMORY DEVICE WITH PROGRAM STATUS DETECTION CIRCUITRY AND THE METHOD THEREOF", which is hereby incorporated by reference.

According to an exemplary embodiment, the above-described operations S120~S160 may constitute a program loop. During repetition of the program loop, a program voltage may increase operation by operation.

Exemplary embodiments of wordline bias conditions required for the local self-boosting described with reference to FIG. 3 will now be described below with reference to accompanying drawings.

Figure 4A:
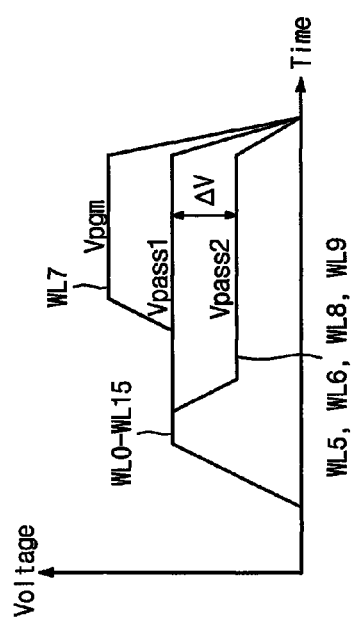
FIG. 4 illustrates a wordline bias condition for local self-boosting according to an embodiment of the present inventive concept and the change of a channel potential.
Figure 4B:
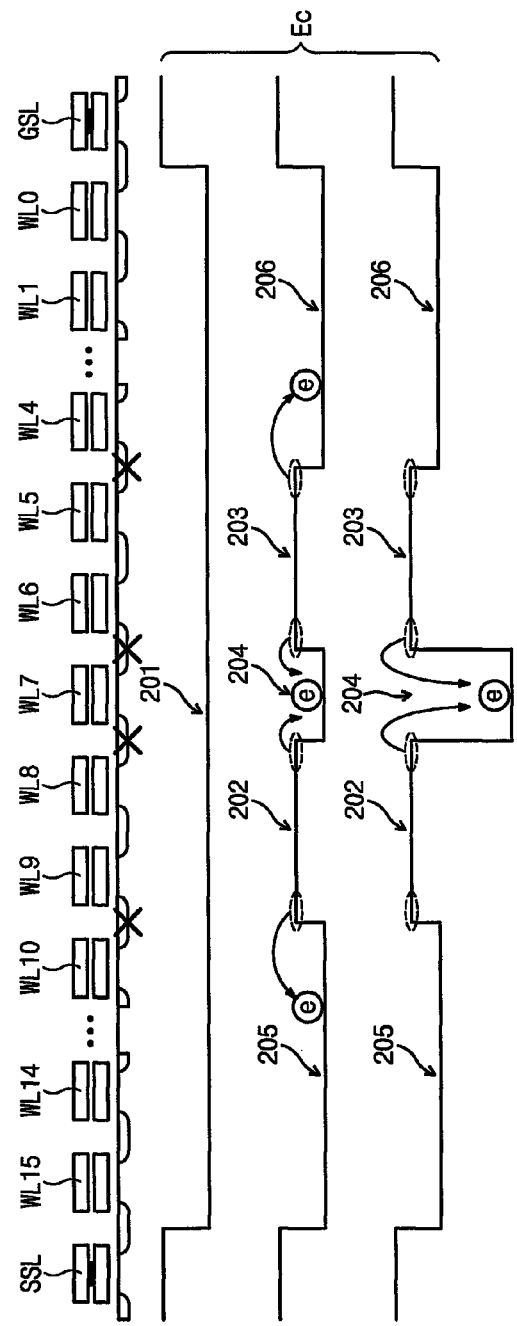

FIG. 4A illustrates a wordline bias condition for local self-boosting according to an embodiment of the present inventive concept. FIG. 4B illustrates the change of a channel potential during local self-boosting performed under the wordline bias condition. A local self-boosting method according to an exemplary embodiment of the present inventive concept will now be described below in detail with reference to accompanying drawings.

For the convenience of description, a local self-boosting method will now be described with reference to one string channel corresponding to a memory cell to be program-inhibited. It is assumed that each string includes sixteen memory cells. However, it will be understood that the number of memory cells constituting a string is not limited to the assumption.

When a string channel corresponding to a memory cell to be program-inhibited is precharged, as fully understood, it may be floated. For the convenience of description, it is assumed that a wordline WL7 is selected. Thereafter, as shown in FIG. 4A, wordlines WL0~WL15 may be driven with a first pass voltage Vpass1 by the row decoder circuit 120. As the wordlines WL0~WL15 are driven with the first pass voltage Vpass1, as shown in FIG. 4B, a global potential wall 201 may be formed at a string channel. Thereafter, wordlines (e.g., WL8 and WL9) adjacent to the upper side of the selected wordline WL7 and wordlines (e.g., WL4 and WL5) adjacent to the lower side of the selected wordline WL7 may be driven with a second pass voltage Vpass2 by the row decoder circuit 120.

According to an exemplary embodiment, the first pass voltage Vpass1 may be higher by the second pass voltage Vpass2 by ΔV. The first pass voltage Vpass1 may be determined to the degree where pass voltage disturbance does not occur. The first and second pass voltages Vpass1 and Vpass2 may be determined within a pass voltage window. The ΔV may be experimentally determined considering a pass voltage, the number of cells, the number of electrons in a channel, and the like.

According to an exemplary embodiment, a wordline (e.g., WL8) adjacent to the upper side of a selected wordline WL7 and a wordline (e.g., WL6) adjacent to the lower side of the selected wordline WL7 may be driven with the second pass voltage Vpass2. It will be understood that the number of wordlines adjacent to opposite sides of the selected wordline WL7 is not limited to that disclosed herein.

As wordlines WL8 and WL9 are driven with the second pass voltage Vpass2, a potential wall 202 may be formed at a channel below the wordlines WL8 and WL9. Similarly, as the wordlines WL5 and WL6 are driven with the second pass voltage Vpass2, a potential wall 203 may be formed at a channel below the wordlines WL5 and WL6. In this case, as shown in FIG. 4B, a potential well 204 defined by the potential walls 202 and 203 may be formed at a channel below the selected wordline WL7. Moreover, a potential well 205 may be formed at the upper side of the well potential well 202 and a potential well 206 may be formed at the lower side of the potential well 203.

Electrons at the potential walls 202 and 203 may migrate to adjacent potential wells 204, 205, and 206 according to a potential difference, as shown by an arrow in FIG. 4B. With the electron migration, electron deficiency may occur at the potential walls 202 and 203 (especially, edge portions (dotted portions) of potential walls). The migration of the electrons through a string channel may be limited by the potential walls 202 and 203, i.e., electron deficiency. This means the string channel is cut by the potential walls 202 and 203. In other words, a local channel corresponding to the potential well 204 may be electrically disconnected from local channels each corresponding to each of the potential walls 205 and 206.

Afterwards, the selected wordline WL7 may be driven with a program voltage Vpgm by the row decoder circuit 120. In this case, the potential well 204 may become deeper, as shown in FIG. 4B. Electrons of the potential walls 202 and 204 may additionally migrate to the potential well 204. Thus, the local channel corresponding to the potential well 204 may be electrically and more strongly disconnected from the local channels each corresponding to each of the potential wells 205 and 206. That is, charge sharing does not occur between the local channel corresponding to the potential well 204 and the local channels each corresponding to each of the potential wells 205 and 206. As the selected wordline WL7 is driven with the program voltage Vpgm, a channel defined by the potential walls 202 and 203 may be locally boosted. That is, local self-boosting occurs. Thus, a memory cell connected to the selected wordline WL7 may be program-inhibited.

Since a string channel including a memory cell to be programmed is connected to a bitline driven with a ground voltage, the above-described voltage change of the string channel may not occur. For this reason, the memory cell may be programmed by a well-known mechanism.

As set forth above, a channel corresponding to a memory cell to be program-inhibited may be locally boosted by the potential walls 202 and 203 for local self-boosting without use of a low wordline voltage (e.g., a voltage between 0 volt and 4 volts). That is, a channel corresponding to a memory cell to be program-inhibited may be boosted by a program voltage Vpgm while being electrically disconnected from an upper local channel corresponding to the potential well 205 and a lower local channel corresponding to the potential well 206.

When a selected wordline is adjacent to a ground select line GSL, wordlines (e.g., WL1 and WL2) disposed at the upper side of the selected wordline may be driven with the second pass voltage Vpass2 after all the wordlines WL0~WL15 are driven with the first pass voltage Vpass1. When a selected wordline is adjacent to a string select line SSL, wordlines (e.g., WL13 and WL14) disposed at the lower side of the selected wordline may be driven with the second pass voltage Vpass2 after all the wordlines WL0~WL15 may be driven with the first pass voltage Vpass1.

Figure 5A:
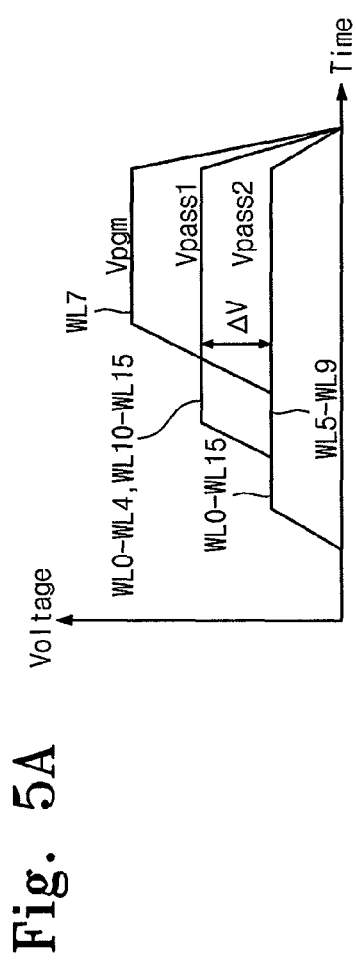
FIG. 5 illustrates wordline bias conditions for local self-boosting according to another embodiment of the present inventive concept and the change of a channel potential.
Figure 5B:
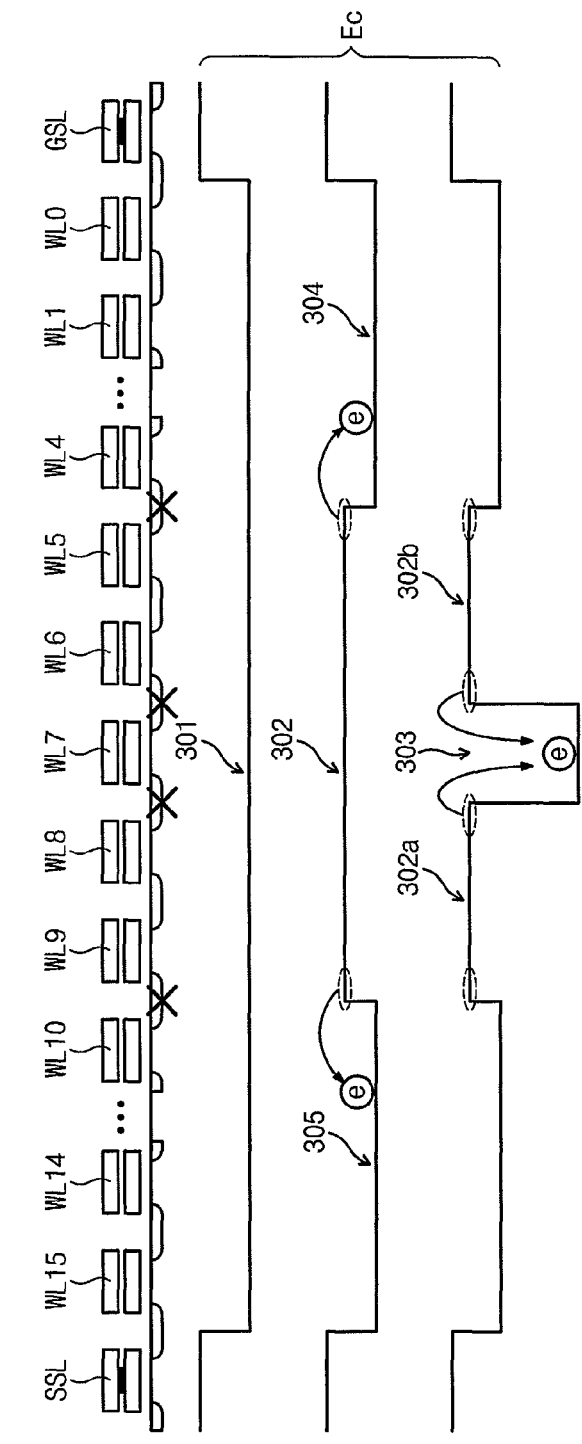

FIG. 5A illustrates a wordline bias condition for local self-boosting according to another embodiment of the present inventive concept. FIG. 5B illustrates the change of a channel potential during local self-boosting performed under the wordline bias condition. A local self-boosting method according to another exemplary embodiment of the present inventive concept will now be described below in detail with reference to accompanying drawings.

For the convenience of description, a local self-boosting method will now be described with reference to one string channel corresponding to a memory cell to be program-inhibited. It is assumed that each string includes sixteen memory cells. However, it will be understood that the number of memory cells constituting a string is not limited to the assumption.

When a string channel corresponding to a memory cell to be program-inhibited is precharged, as fully understood, it may be floated. For the convenience of description, it is assumed that a wordline WL7 is selected. Thereafter, as shown in FIG. 5A, wordlines WL0~WL15 may be driven with a second pass voltage Vpass2 by the row decoder circuit 120. As the wordlines WL0~WL15 are driven with the second pass voltage Vpass2, as shown in FIG. 5B, a global potential wall 301 may be formed at a string channel.

Thereafter, wordlines (e.g., WL8 and WL9) adjacent to the upper side of the selected wordline WL7, wordlines (e.g., WL5 and WL6) adjacent to the lower side of the selected wordline WL7, and the other wordlines (e.g., WL0~WL4 and WL10~WL15) except the selected wordline WL7 may be driven with a first pass voltage Vpass1 by the row decoder circuit 120. As mentioned above, the first pass voltage Vpass1 may be higher by the second pass voltage Vpass2 by ΔV. The first pass voltage Vpass1 may be determined to the degree where pass voltage disturbance does not occur. The first and second pass voltages Vpass1 and Vpass2 may be determined within a pass voltage window.

According to an exemplary embodiment, a wordline (e.g., WL8) adjacent to the upper side of a selected wordline WL7, a wordline (e.g., WL6) adjacent to the lower side of the selected wordline WL7, the other wordlines (e.g., WL0~WL4 and WL10~WL15) except the selected wordline WL7 may be driven with the first pass voltage Vpass1. It will be understood that the number of wordlines adjacent to opposite sides of the selected wordline WL7 is not limited to that disclosed herein.

As wordlines (e.g., WL0~WL4 and WL10~WL15) are driven with the first pass voltage Vpass1, a potential wall 302 may be formed at a string channel. The potential wall 302 may be defined by the wordlines WL5~WL9. As the potential wall 302 is formed, potential walls 305 and 304 may be formed in the string channel, respectively. Electrons at the potential wall 302 may migrate to adjacent potential wells 305 and 304 according to a potential difference. With the electron migration, electron deficiency may occur at the potential wall 302

(especially, edge portions (dotted portions) of potential walls). The migration of the electrons through a string channel may be limited by the potential wall 302, i.e., electron deficiency. This means the string channel is cut by the potential wall 302.

Afterwards, the selected wordline WL7 may be driven with a program voltage Vpgm by the row decoder circuit 120. In this case, a potential well 303 may be formed within the potential wall 302, as shown in FIG. 5B. In other words, the potential wall 302 may be divided into two potential walls 302a and 302b. At this point, electrons of the two potential walls 302A and 302B may migrate to the potential well 303. With the migration of the electrons, electron deficiency may occur at the potential walls 302a and 302b (especially, edge portion (dotted portions) of potential walls). The migration of the electrons through a string channel may be limited by the potential walls 302a and 302b, i.e., the electron deficiency. Accordingly, a channel corresponding to the potential well 303 may be electrically disconnected from channels each corresponding to each of the potential walls 305 and 304. Charge sharing does not occur between a local channel corresponding to the potential well 303 and the local channels each corresponding to each of the potential wells 304 and 305. As the selected wordline WL7 is driven with the program voltage Vpgm, a channel defined by the potential walls 302a and 302b may be locally boosted. That is, local self-boosting occurs and thus a memory cell connected to the selected wordline WL7 may be program-inhibited.

When a selected wordline is adjacent to a ground select line GSL, wordlines (e.g., WL3~WL15) except wordlines (e.g., WL1 and WL2) disposed at the upper side of the selected wordline may be driven with the first pass voltage Vpass1 after all the wordlines WL0~WL15 are driven with the second pass voltage Vpass2. When a selected wordline is adjacent to a string select line SSL, wordlines (e.g., WL0~WL12) except wordlines (e.g., WL13 and WL14) disposed at the lower side of the selected wordline may be driven with the first pass voltage Vpass1 after all the wordlines WL0~WL15 may be driven with the second pass voltage Vpass2.

Figure 6:
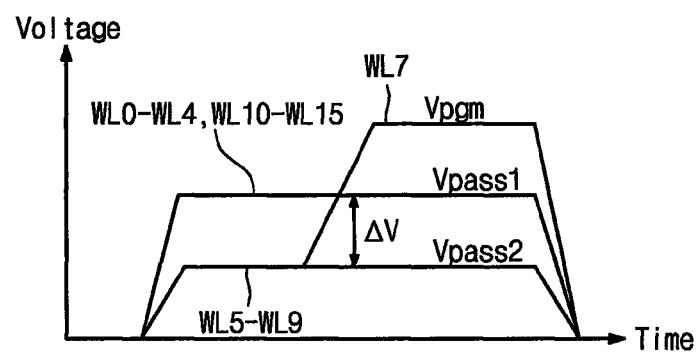
FIG. 6 illustrates wordline bias conditions for local self-boosting according to another embodiment of the present inventive concept.

FIG. 6 illustrates wordline bias conditions for local self-boosting according to another embodiment of the present inventive concept. The local self-boosting method illustrated in FIG. 6 is substantially identical to that illustrated in FIG. 5, except that driving a selected wordline (e.g., WL7) and adjacent wordlines (e.g., WL5, WL6, WL8, and WL9) is done simultaneously to driving the other wordlines (WL0~WL4 and WL10~WL15). Therefore, the local self-boosting method illustrated in FIG. 6 will not be described in further detail.

Figure 7:
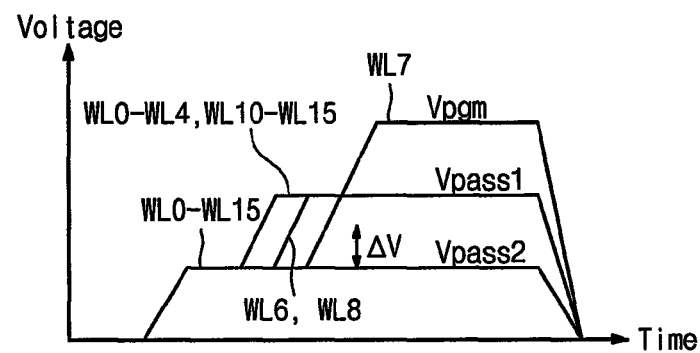
FIG. 7 illustrates wordline bias conditions for local self-boosting according to another embodiment of the present inventive concept.

FIG. 7 illustrates wordline bias conditions for local self-boosting according to another embodiment of the present inventive concept.

The local self-boosting method illustrated in FIG. 7 is substantially identical to that illustrated in FIG. 5, except the fact that will now be described, and will not be described in further detail. As illustrated in FIG. 7, wordlines (e.g., WL6 and WL8) just adjacent to a selected wordline (e.g., WL7) may be driven with a first pass voltage Vpass1 after wordlines (WL0~WL5 and WL9~WL15) are driven with the first pass voltage Vpass1 and before the selected wordline WL7 is driven with a program voltage Vpgm (or when the selected wordline WL7 is driven with a program voltage Vpgm).

Figure 8A:
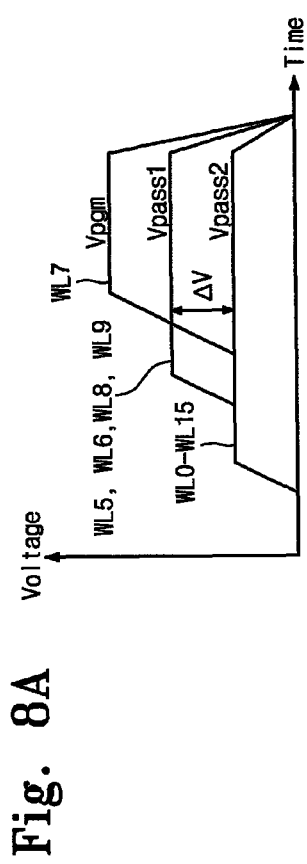
FIG. 8 illustrates wordline bias conditions for local self-boosting according to another embodiment of the present inventive concept and the change of a channel potential.
Figure 8B:
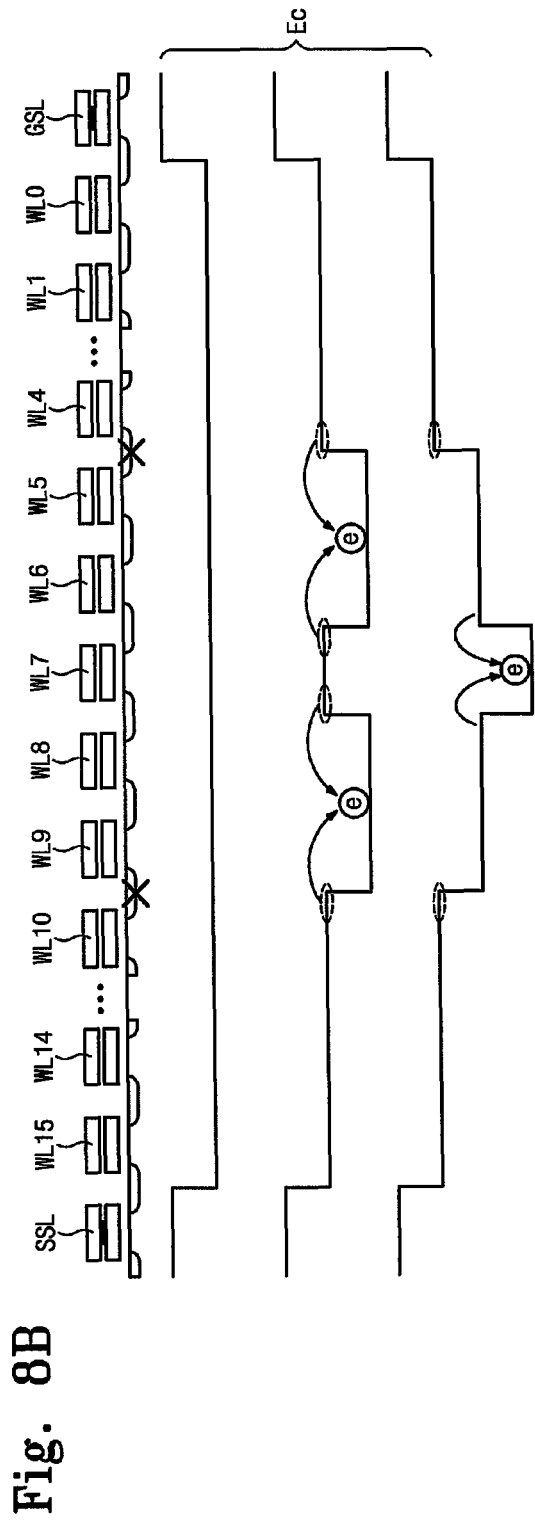

FIG. 8A illustrates a wordline bias condition for local self-boosting according to another embodiment of the present inventive concept. FIG. 8B illustrates the change of a channel potential during local self-boosting performed under the wordline bias condition. A local self-boosting method according to another exemplary embodiment of the present inventive concept will now be described below in detail with reference to accompanying drawings.

For the convenience of description, a local self-boosting method will now be described with reference to one string channel corresponding to a memory cell to be program-inhibited. It is assumed that each string includes 16 memory cells. However, it will be understood that the number of memory cells constituting a string is not limited to the assumption.

When a string channel corresponding to a memory cell to be program-inhibited is precharged, as fully understood, it may be floated. For the convenience of description, it is assumed that a wordline WL7 is selected. Thereafter, as shown in FIG. 8A, wordlines WL0~WL15 may be driven with a second pass voltage Vpass2 by the row decoder circuit 120. Wordlines (e.g., WL8 and WL9) adjacent to the upper side of the selected wordline WL7 and wordlines (e.g., WL4 and WL5) adjacent to the lower side of the selected wordline WL7 may be driven with a first pass voltage Vpass1 by the row decoder circuit 120. The selected wordline WL7 may be driven with a program voltage Vpgm by the row decoder circuit 120. As the selected wordline WL7 is driven with the program voltage Vpgm, a channel below the selected wordline WL7 may be locally boosted. That is, local self-boosting may occur and thus a memory cell connected to the selected wordline WL7 may be program-inhibited. The channel potential change according to the wordline bias condition is illustrated in FIG. 8B. Charge deficiency may occur at edge portions (dotted portions) in FIG. 8B. As set forth above, due to the charge deficiency, a channel of a program-inhibited memory cell may be locally limited.

According to an exemplary embodiment, a wordline (e.g., WL8) adjacent to the upper side of a selected wordline WL7 and a wordline (e.g., WL6) adjacent to the lower side of the selected wordline WL7 may be driven with a first pass voltage Vpass1. It will be understood that the number of wordlines adjacent to opposite sides of the selected wordline WL7 is not limited to that disclosed herein.

Since a string channel including a memory cell to be programmed is connected to a bitline driven with a ground voltage, the above-described voltage change of the string channel may not occur. For this reason, the memory cell may be programmed by a well-known mechanism.

Figure 9A:
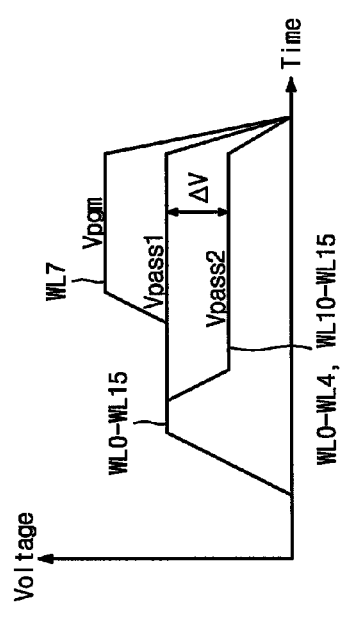
FIG. 9 illustrates wordline bias conditions for local self-boosting according to another embodiment of the present inventive concept and the change of a channel potential.
Figure 9B:
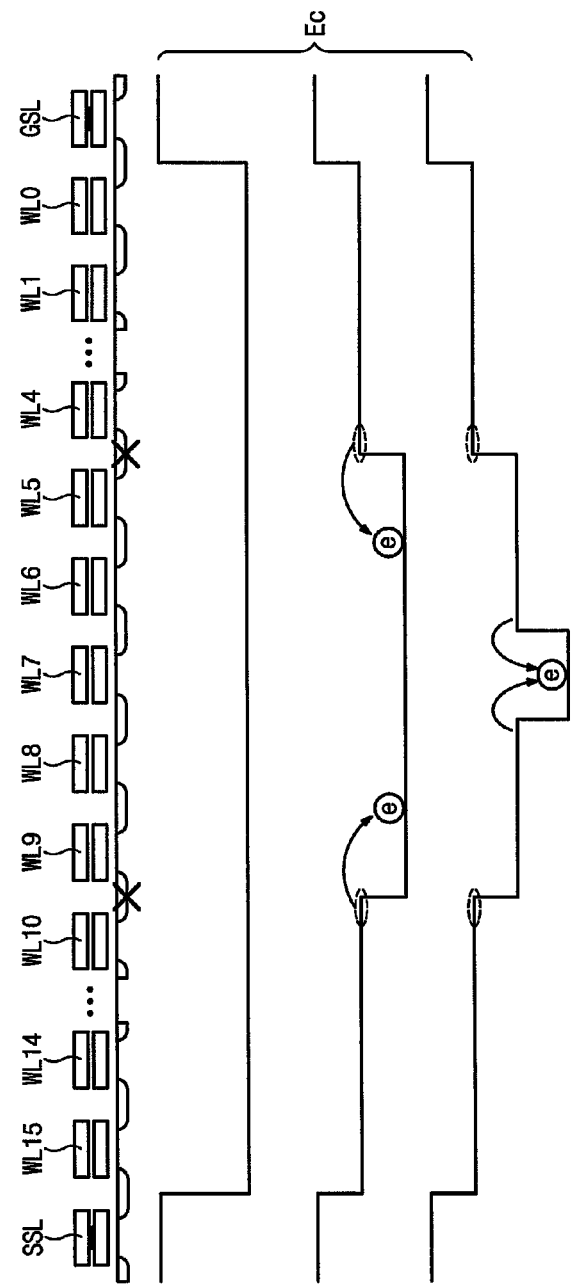

FIG. 9A illustrates a wordline bias condition for local self-boosting according to another embodiment of the present inventive concept. FIG. 9B illustrates the change of a channel potential during local self-boosting performed under the wordline bias condition. A local self-boosting method according to another exemplary embodiment of the present inventive concept will now be described below in detail with reference to accompanying drawings.

Referring to FIG. 9A, wordlines WL0~WL15 may be driven with a first pass voltage Vpass1 by the row decoder circuit 120. Thereafter, wordlines (e.g., WL8 and WL9) adjacent to the upper side of a selected wordline WL7, wordlines (e.g., WL5 and WL6) adjacent to the lower side of the selected wordline WL7, and the other wordlines WL0~WL4 and WL10~WL15 except the selected wordline WL7 may be driven with a first pass voltage Vpass1 by the row decoder circuit 120. The selected wordline WL7 may be driven with a program voltage Vpgm by the row decoder circuit 120. As the selected wordline WL7 is driven with the program voltage Vpgm, a channel below the selected wordline WL7 may be locally boosted. That is, local self-boosting may occur and thus a memory cell connected to the selected wordline WL7 may be program-inhibited. The channel potential change according to the wordline bias condition is illustrated in FIG. 9B. Charge deficiency may occur at edge portions (dotted portions) in FIG. 9B. As set forth above, due to the charge deficiency, a channel of a program-inhibited memory cell may be locally limited.

Figure 10:
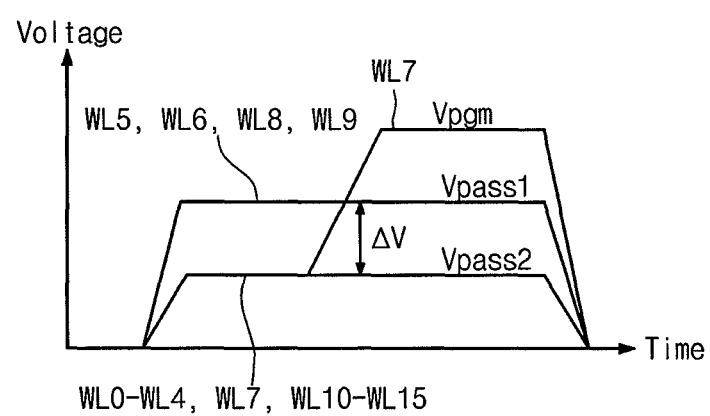
FIG. 10 illustrates wordline bias conditions for local self-boosting according to another embodiment of the present inventive concept.

FIG. 10 illustrates wordline bias conditions for local self-boosting according to another embodiment of the present inventive concept. The local self-boosting method illustrated in FIG. 10 is substantially identical to that illustrated in FIG. 8A, except that driving a selected wordline (e.g., WL7) and adjacent wordlines (e.g., WL5, WL6, WL8, and WL9) is done simultaneously to driving the other wordlines (WL0~WL4, WL7, and WL10~WL15). Therefore, the local self-boosting method illustrated in FIG. 10 will not be described in further detail.

Although not shown in the drawing, it will be understood that dummy wordlines may be provided between outermost wordlines (e.g., WL0 and WL15) and select lines SSL and GSL, respectively.

Figure 11:
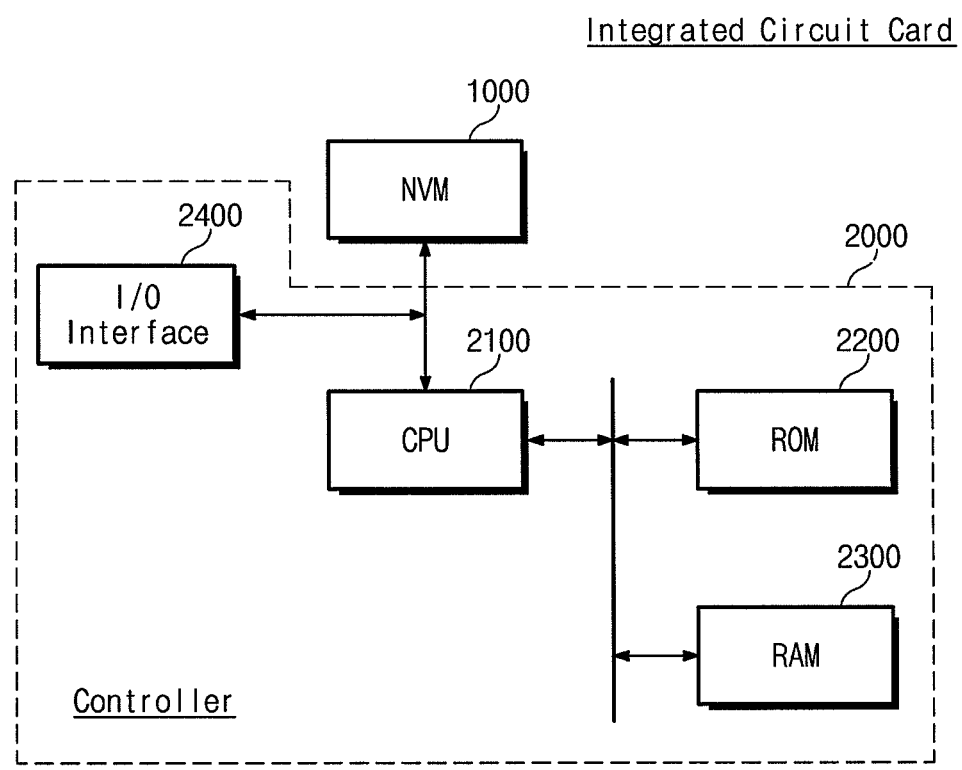
FIG. 11 illustrates a block diagram of an integrated circuit (IC) card including a flash memory device according to an exemplary embodiment of the present inventive concept.

FIG. 11 illustrates a block diagram of an integrated circuit (IC) card including a flash memory device according to an exemplary embodiment of the present inventive concept. Referring to FIG. 11, an IC card (e.g., smart card) includes a nonvolatile memory device 1000 and a controller 2000. The nonvolatile memory device 1000 may have the same structure as shown in FIG. 1 and will not be described in further detail. The controller 2000 controls the nonvolatile memory device 1000 and includes a central processing unit (CPU) 2100, a read-only memory (ROM) 2200, a random access memory (RAM) 2300, and an input/output interface (I/O interface) 2400. The CPU 2100 controls the overall operation of the IC card depending on various programs stored in the CPU 2100 and provides interface with an external entity. The same program method as described above may be applied to the nonvolatile memory device 100, as a flash memory device.

Figure 12:
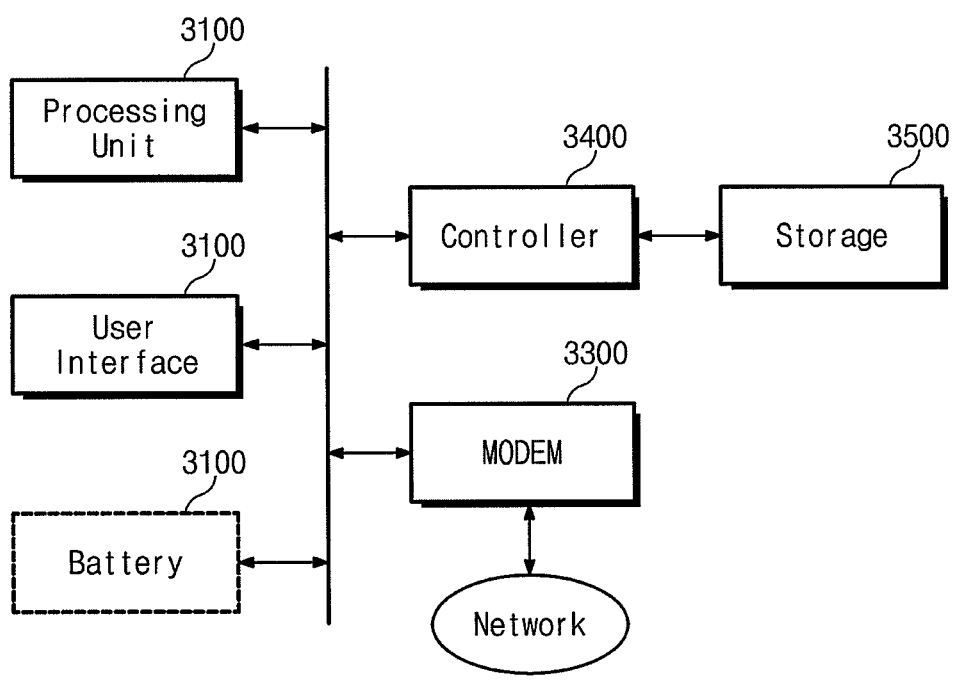
FIG. 12 illustrates a block diagram of a computing system including a flash memory device according to an exemplary embodiment of the present inventive concept.

Flash memory device are nonvolatile memory device which retain their stored data even when their power supplies are interrupted. With the increase in use of mobile devices, e.g., a cellular phone, a personal digital assistant (PDA), a digital camera, a portable game console, an MP3 player, and so forth, the flash memory device may be more widely used as a data storage and/or a code storage. The flash memory device may be used in home applications, e.g., a high definition television (HDTV), a digital video disk (DVD), a router, and a global positioning system (GPS). A computing system including a flash memory device according to an exemplary embodiment of the present inventive concept is illustrated in FIG. 12.

A computing system according to the present inventive concept includes a microprocessor 3100, a user interface 3200, a modem 3300, e.g., a baseband chipset, and a storage media 3500 including flash memories, which are electrically connected to a bus. The modem 330 may be connected to a network through a wireless or wired device. The same program method as illustrated in FIG. 1 may be applied to a flash memory of the storage media. N-bit data (N being 1 or greater integer) processed/to be processed by the microprocessor 3100 may be stored in the storage media through the memory controller 3400. If the computing system according to the present inventive concept is a mobile device, a battery 3600 may be additionally provided to supply a work voltage to the computing system. Although not illustrated in the drawings, it should apparent to those skilled in the art that an application chipset, a camera image processor (CIS), a mobile dynamic random access memory (DRAM), etc., may be further provided in the computing system 2000 according to the present inventive concept.

According to an exemplary embodiment, the controller 3400 and the storage media 3500 may constitute a solid state drive (SSD), a memory card, and so forth.

The flash memory device and/or the controller 3400 may be mounted using various types of packages. Examples of the packages may include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

According to an exemplary embodiment, memory cells may be realized with one of various cell structures having a charge storage layer. It should be apparent to those skilled in the art that a charge trap flash structure using a charge trap layer, a stack flash structure having multilayer-stacked arrays, a flash structure without a source and a drain, and/or a pin-type flash structure may be applied to the above cell structure having a charge storage layer.

A memory device having a charge trap flash structure as a charge storage layer is disclosed in U.S. Pat. No. 6,858,906, Publication No. 2004-0169238, and Publication No. 2006-0180851, which are hereby incorporated by reference. A flash structure without a source and a drain is disclosed in Korean Patent Registration No. 10-0673020, which is hereby incorporated by reference.

As explained so far, according to the present inventive concept, a local self-boosting operation can be performed without use of low voltages.

While the present inventive concept has been described with reference to exemplary embodiments, it will be apparent to those skilled in the art that various changes and modifications may be made without departing from the spirit and scope of the present inventive concept. Therefore, it should be understood that the above embodiments are not limiting, but illustrative. Thus, the scope of the present inventive concept is to be determined by the broadest permissible interpretation of the following claims and their equivalents, and shall not be restricted or limited by the foregoing description.

What is claimed is:

1. A local self-boosting method of a flash memory device including at least one string having memory cells respectively connected to wordlines, the local self-boosting method comprising:

forming a potential well at a channel of the at least one string, forming the potential well includes driving the wordlines with a first pass voltage; and forming potential walls at the potential well to be disposed at both sides of a channel of a selected one of the memory cells, forming potential walls includes driving at least one wordline adjacent respectively to both sides of a wordline connected to the selected memory cell with a second pass voltage that is lower than the first pass voltage, wherein:

the channel of the selected memory cell is locally limited by the potential walls and boosted when a program voltage is applied to the selected memory cell, application of the program voltage to the selected memory cell starting after driving of the at least one wordline with the second pass voltage has started.

2. The local self-boosting method as claimed in claim 1, wherein the first and second pass voltages are within a pass voltage window.

3. The local self-boosting method as claimed in claim 1, wherein the at least one wordline adjacent respectively to both sides of a wordline connected to the memory cell is driven with the second pass voltage after the other wordlines are driven with the second pass voltage and before the wordline connected to the selected memory cell is driven with a program voltage.

4. The local self-boosting method as claimed in claim 1, wherein forming the potential well and forming potential walls are performed simultaneously.

5. The local self-boosting method as claimed in claim 1, wherein the selected memory cell is a memory cell to be program-inhibited.

6. The local self-boosting method as claimed in claim 1, wherein a potential of a channel of the string does not change when the selected memory cell is a memory cell to be programmed.

7. A program method of a flash memory device including at least one string having memory cells respectively connected to wordlines, the program method comprising:
   driving the wordlines with a first pass voltage to form a potential well at a channel of the at least one string;
   driving at least one wordline adjacent respectively to both sides of a selected one of the wordlines with a second pass voltage that is lower than the first pass voltage, to form potential walls at the potential well to be disposed at both sides of a channel of a selected one of the memory cells, the channel of the selected memory cell being locally limited by the potential walls; and
   driving the selected wordline with a program voltage such that the channel of the selected memory cell is boosted when the program voltage is applied to the selected memory cell, application of the program voltage to the selected memory cell starting after driving of the at least one wordline with the second pass voltage has started.

8. The program method as claimed in claim 7, wherein the first pass voltage is higher than the second pass voltage.

9. The program method as claimed in claim 8, wherein the first and second pass voltages are within a pass voltage window.

10. The program method as claimed in claim 7, wherein a memory cell connected to the selected wordline is a memory cell to be program-inhibited.

11. A program method of a flash memory device including at least one string having memory cells respectively connected to wordlines, the program method comprising:
    driving the wordlines with a first pass voltage to form a potential well at a channel of the at least one string;
    driving at least one wordline adjacent respectively to both sides of a selected one of the wordlines and other wordlines, except the selected wordline, with a second pass voltage that is lower than the first pass voltage, to form potential walls at the potential well to be disposed at both sides of a channel of a selected one of the memory cells, the channel of the selected memory cell being locally limited by the potential walls; and
    driving the selected wordline with a program voltage such that the channel of the selected memory cell is boosted when the program voltage is applied to the selected memory cell, application of the program voltage to the selected memory cell starting after driving of the at least one wordline with the second pass voltage has started.

12. The program method as claimed in claim 11, wherein the first pass voltage is lower than the second pass voltage.

13. The program method as claimed in claim 11, wherein, when two wordlines respectively adjacent to both sides of the selected wordline are driven with the first pass voltage, one wordline just adjacent respectively to both sides of the selected wordline is driven with the second pass voltage before the selected wordline is driven with the program voltage.

14. A flash memory device, comprising:
    at least one string having memory cell respectively connected to wordlines; and
    a control logic configured to control voltage to be supplied to the wordlines during a program operation, wherein:
    the control logic controls voltages of the wordlines such that the program operation is performed in a local self-boosting manner including forming a potential well at a channel of the string and forming potential walls at the potential well to be disposed at both sides of a channel of a selected one of the memory cells, forming the potential well including driving the wordlines with a first pass voltage, and forming potential walls including driving at least one wordline adjacent respectively to both sides of a wordline connected to the selected memory cell with a second pass voltage that is lower than the first pass voltage, and
    the channel of the selected memory cell is locally limited by the potential walls such that the channel of the selected memory cell is boosted when a program voltage is applied to the selected memory cell during the program operation when application of the program voltage to the selected memory cell started after driving of the at least one wordline with the second pass voltage had started.

* * * * *